(12) United States Patent
Pulskamp et al.

(10) Patent No.: US 8,966,993 B2
(45) Date of Patent: Mar. 3, 2015

(54) THREE DIMENSIONAL PIEZOELECTRIC MEMS

(71) Applicant: U.S. Army Research Laboratory, Adelphi, MD (US)

(72) Inventors: Jeffrey S. Pulskamp, Leesburg, VA (US); Ronald G. Polcawich, Derwood, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 245 days.

(21) Appl. No.: 13/719,588

(22) Filed: Dec. 19, 2012

(65) Prior Publication Data

US 2014/0230560 A1   Aug. 21, 2014

(51) Int. Cl.
| | |
|---|---|
| *G01N 3/00* | (2006.01) |
| *H03H 9/205* | (2006.01) |
| *G01L 1/00* | (2006.01) |
| *H03H 3/02* | (2006.01) |
| *H03H 9/15* | (2006.01) |

(52) U.S. Cl.
CPC .............. *H03H 9/205* (2013.01); *G01L 1/005* (2013.01); *H03H 3/02* (2013.01); *H03H 2009/155* (2013.01)
USPC .......................................................... 73/788

(58) Field of Classification Search
USPC .......................................................... 73/788
See application file for complete search history.

(56) References Cited

U.S. PATENT DOCUMENTS

| | | | | |
|---|---|---|---|---|
| 5,606,451 | A * | 2/1997 | Kim et al. ..................... | 359/290 |
| 5,636,051 | A * | 6/1997 | Lim .............................. | 359/290 |
| 6,756,247 | B1 * | 6/2004 | Davis et al. .................... | 438/52 |

* cited by examiner

*Primary Examiner* — Lisa Caputo
*Assistant Examiner* — Octavia Hollington
(74) *Attorney, Agent, or Firm* — Alan I. Kalb

(57) ABSTRACT

Method and apparatus for a piezoelectric apparatus are provided. In some embodiments, a method for fabricating a piezoelectric device may include etching a series of vertical trenches in a top substrate portion, depositing a first continuous conductive layer over the trenches and substrate, depositing a continuous piezoelectric layer over the first continuous conductive layer such that the piezoelectric material has trenches and sidewalls, depositing a second continuous conductive layer over the continuous piezoelectric layer, etching through the vertical trenches of the first continuous conductive layer, continuous piezoelectric layer, second continuous conductive layer, and top substrate portion into a bottom substrate portion, etching a series of horizontal trenches in the bottom substrate portion such that the horizontal trenches and vertical trenches occupy a continuous free space and allow movement of a piezoelectric MEMS device created by the above method in three dimensions.

14 Claims, 7 Drawing Sheets

THREE DIMENSIONAL PIEZOELECTRIC MEMS

GOVERNMENT INTEREST

Governmental Interest—The invention described herein may be manufactured, used and licensed by or for the U.S. Government.

FIELD OF INVENTION

Embodiments of the present invention generally relate to a piezoelectric materials. specifically, microelectromechanical system (MEMS) using piezoelectric materials.

BACKGROUND OF THE INVENTION

The piezoelectric effect is a reversible process whereby certain materials may internally generate electrical charge resulting from an applied mechanical force, or inversely generate mechanical strain resulting from an applied electric field. Piezoelectric materials may be used to form devices such as actuators, sensors, and motors. Traditional macroscopic piezoelectric devices utilize "bulk" piezoelectric material that because of large thicknesses, typically require large operating voltages in actuator applications. The same devices have increased versatility as the piezoelectric material and corresponding device structure are implemented in smaller form factors. Currently, one of the smallest developed implementations is through the use of microelectromechanical systems, microelectromechanical machines, or micromachines (generally referred to as MEMS) technology. MEMS can exploit the properties of thin film piezoelectric material to miniaturize piezoelectric devices. In contrast to bulk piezoelectric material, thin film piezoelectric material can be operated at very small voltages and the very thin structures that can be realized in MEMS allow for much larger displacements relative to the size of the actuator than with bulk piezoelectrics.

The piezoelectric MEMS technology is, however, limited when it is desired to form more than one piezoelectric thin film layer on the same substrate. FIG. 1 is an illustration of a conventional piezoelectric deposition comprising a silicon substrate 100, silicon dioxide layer 105, and metal layers ($115_1$, $115_2$, and $115_n$ hereinafter referred to as 115) on opposite sides of piezoelectric material layers ($110_1$ and $110_n$ hereinafter 110). The fabrication technique includes the deposition on a substrate 100 (such as silicon) and insulator 105 (e.g. silicon dioxide) of alternating two dimensional layers of metal 115 and piezoelectric material 110 of varying size, stacked on top of the same substrate 100. The ratio of the thickness of the piezoelectric layer to the thickness of the substrate is typically quite small, such as 1/300 or less. The aforementioned vertical stacking of such two dimensional structures limits the realization of a large volume of thin film piezoelectric material per unit area of the silicon substrate 100, as each subsequent piezoelectric layer 110 requires additional deposition and possibly additional etching fabrication stages.

For example, obtaining a conventional device comprised of 50 piezoelectric layers (110) may require the deposition of 50 piezoelectric layers (110), and 100 layers of metal (115). Thus, it becomes difficult to obtain a large volume of thin film piezoelectric material per unit area of the same substrate without drastically increasing the number of material layers when using traditional methods.

Therefore, a method and apparatus is needed to effectively form multiple piezoelectric thin film structures on the same substrate while enabling device operation in a third dimension and conserving manufacturing cost.

BRIEF SUMMARY OF THE INVENTION

Methods and apparatus for a three dimensional piezoelectric device are provided herein. More specifically, piezoelectric apparatus comprising a substrate, a first stacked actuator arm comprising a piezoelectric, layer between a first metal layer and a second metal layer on the substrate, a second stacked actuator arm comprising the piezoelectric layer between the first metal layer and the second metal layer on the substrate, the first and second stacked actuator arm separated from each other by a vertical trench and separated from the substrate by a horizontal trench such that the actuators are capable of movement in three dimensions. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
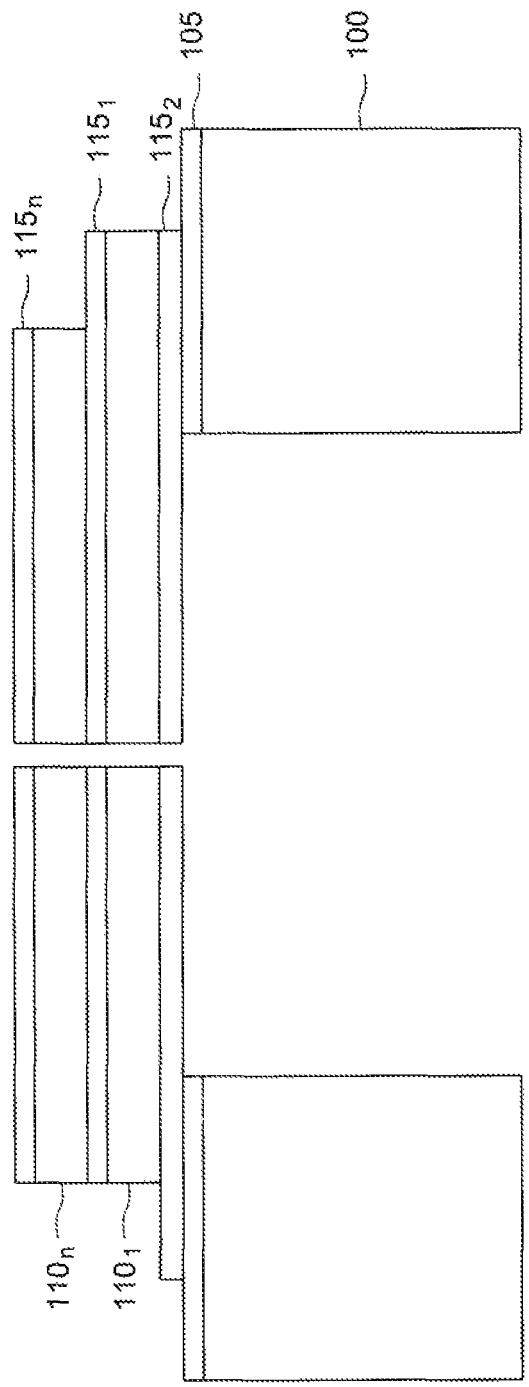
FIG. 1 is an illustration of a conventional piezoelectric deposition technique.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION OF THE INVENTION

The present invention relates to three dimensional piezoelectric actuators on a shared substrate area. Formation of the exemplary embodiment of the present invention produces greater usable thin film volume through strategic high aspect ratio etching of the actuators and corresponding trenches. Specifically, in one exemplary embodiment of the present invention, the height of the trenches are orders of magnitude greater than the width, resulting in improvements of the work per unit area and greater density of operable piezoelectric devices for a given area. Since piezoelectric actuator properties such as force, displacement and work for example are directly related to the volume of thin film material in the device, the processes utilize thin-film fabrication materials (typically less than about 3 μm in thickness). The performance of piezoelectric MEMS devices can therefore be improved by increasing the volume of thin film piezoelectric material per unit area of the silicon substrate.

Figure 2:
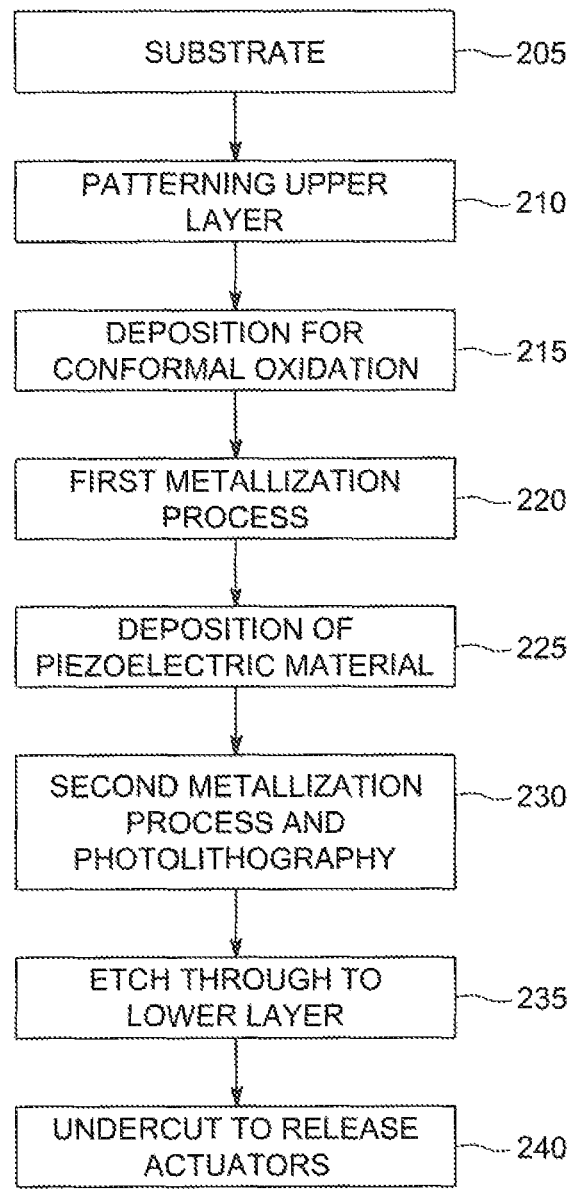
FIG. 2 is a flowchart for an exemplary embodiment of the present invention.

FIG. 2 is a flowchart for an exemplary embodiment of the present invention. The process flow 200 begins at step 205 with a choice of substrate, in this embodiment, a silicon-on-insulator (SOI) substrate comprising an upper (device) and lower (handle) silicon layers with a buried thermal dioxide or buried oxide (as known as BOX) between the silicon layers. Next, the upper device layer of the substrate is etched at step 210, to produce a pattern for initial trenches and at step 215 a conformal elastic layer, typically a dielectric layer, is added. A first metallization process step 220 creates a first metal contact for piezoelectric material deposited at step 225. A second metallization process and photolithography patterning step 230 creates a second metal contact above the deposited piezoelectric material. Etching through to the lower Si layer is applied at step 235 to separate the conformal piezoelectric material into individual actuator arms, which are undercut at step 240 to release the actuator arms from the lower silicon layer. Following the undercutting step 240, the device is able to oscillate or vibrate when an electrical field is applied across the thickness of the piezoelectric material or conversely, generate a charge from external mechanical stress applied across the piezoelectric material.

Figure 3:
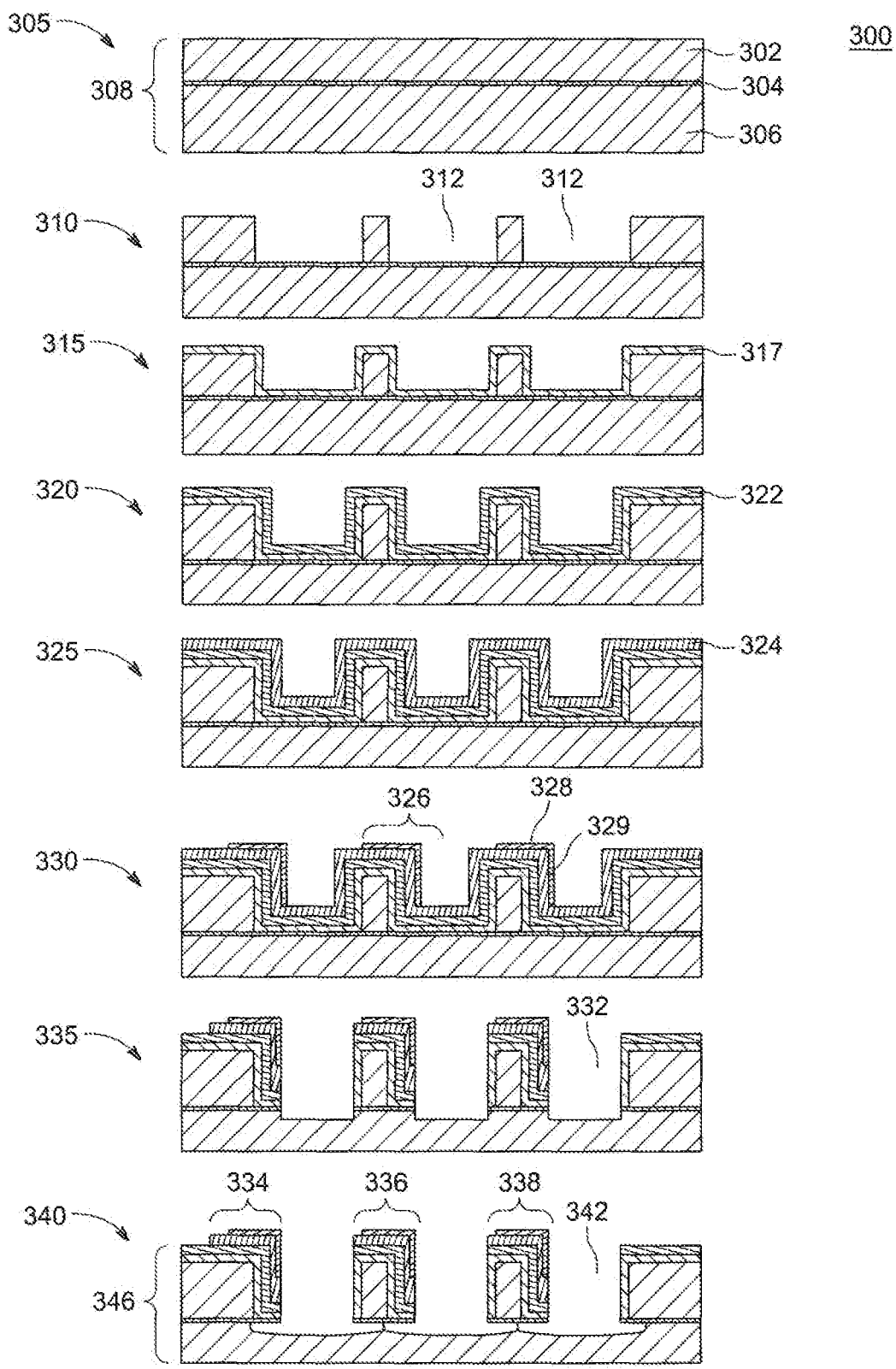
FIG. 3 is a cut-away illustration of an exemplary embodiment of the present invention through process flow stages.

FIG. 3 depicts an exemplary embodiment of the invention 300 using lead zirconate titanate (PZT) MEMS devices. The process begins with a depiction of the apparatus stage 305 for forming a SOI substrate 308 comprising a lower silicon handle layer 306, a buried silicon dioxide $SiO_2$ layer (BOX) 304, and an upper silicon device layer 302. The next stage 310 etches the device layer 302 with a series of vertical trenches 312. Following the initial etching 310, a stage 315 forms a conformal elastic layer 317 over the device layer 302 by growing a dielectric such as thermal oxide, or use of atomic layer deposition for oxidation. Once the oxidation layer 317 is formed, a metallization stage 320 deposits a first metal layer such as bi-layer metal titanium dioxide ($TiO_2$)/platinum (Pt) 322 over the elastic layer 317 using growth templates to promote proper crystallographic texture in the subsequent piezoelectric layer. However, additional embodiments may use other conducive metals or conductive oxides (e.g. $IrO_2$, $RuO_2$) may be used.

Stage 325 deposits a piezoelectric material layer 324 on the first metallization layer 322. Although the piezoelectric layer may be formed by deposition of one of many different piezoelectric materials, in an exemplary embodiment of the invention, the piezoelectric layer is comprised of lead zirconate titanate (PZT). The PZT 324 may be deposited via spin-on techniques, spray-on techniques, or atomic layer deposition, so as to adequately conform to the first metallization layer 322. At stage 336 the PZT 324 is conformally covered (not shown) with a second metallization layer 326 which may also be comprised of platinum. The second platinum layer 326 is then patterned using a photolithography process and photoresist etching process such that the second platinum layer 326 covers not just the horizontal top surface 328 of the PZT 324 but also at least one vertical side wall 329.

Next a high aspect ratio (trench length compared to the trench width) is achieved stage 335 by etching vertical trenches 332 all the way through the piezoelectric layer 324, metal 1 322, elastic layer 317, and BOX 304 and into the handle layer 306. The trenches 332 may be etched using combinations of etching and/or ion-milling. The final stage 340 uses selective Xenon difluoride $XeF_2$ to etch horizontal trenches 342 to release the just formed actuators 334, 336, and 338 from the underlying handle wafer Si 306, such that the center sections 336 and 338 are free floating and anchored at a location away from the floating portion (as will be discussed later on in FIG. 4). It is noted that horizontal trenches 342 and vertical trenches 332 comprise the same open space. The released actuators 419 and 421 may now vibrate/oscillate in three dimensions when an electric field is passed perpendicularly between the two conductive metal layers (322 and 407) through the PZT 402 layer. The first actuator 416 is an example wherein it may be desirable to have the actuator 416 attached to the device layer and/or not have a free floating structure, by anchoring the actuator on a fourth side 346. Similarly, when operated as a sensor, charges generated by the PZT 324 when the device is placed under mechanical strain, would be conducted by the conductive metal layers 322, 326, and 328.

The aforementioned embodiment thus allows more work per unit area (i.e. force times displacement over area) that scales as the depth of the trenches 332 (or height of the is sidewalls 329) over the pitch. Pitch is the distance from one piezoelectric structure to the next repeated piezoelectric structure. In order to achieve improved performance of a piezoelectric material over the traditional vertical stacked piezoelectric structures, it is necessary to have a large depth over pitch ratio. For example, an exemplary embodiment may have actuators with trench depths of 100 μm, and spaced evenly every 10 μm, resulting in a work per unit area increase of a factor of ten. Thus, improvement in area utilization by the present structures over the traditional vertical stacked piezoelectric structures may be in the orders of magnitude. Furthermore, by allowing sidewall deposition of the PZT actuators 334, 336, and 338 and a floating structure over the horizontal trenches 342, the aforementioned embodiment allows for device operation in three dimensions.

Figure 4:
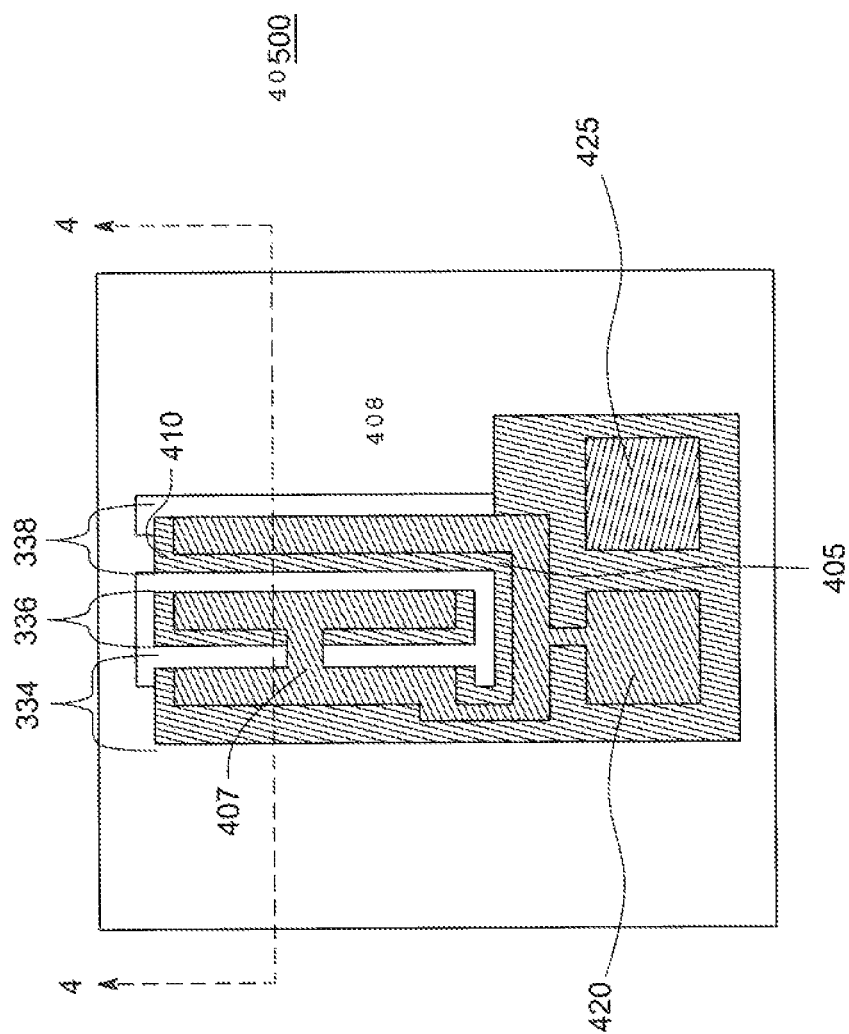
FIG. 4 is a top view of the final exemplary embodiment of the present invention achieved through the process of FIG. 3.

FIG. 4 is a top view of an exemplary embodiment of the present invention and includes line 4-4 that is the basis for the aforementioned cutaway view of stage 340. The embodiment 400 is an etching in the silicon wafer 308 such that three stacked actuator arms (334, 336, and 338) are laterally formed into arms anchored on the same area of the silicon wafer substrate 308. The embodiment 400 depicts actuators 334, 336, and 338 which may be jointly coupled and cantilevered by the distal end of actuator 334 such that actuators 334 and 336 operate together. Alternatively, actuator 338 provides an example to of independently coupling the actuator 338 to the substrate 308 such that the actuator 338 is clamped at both ends (405 and 410). The jointly coupled actuators 334 and 336 are mechanically coupled by the upper platinum layer 407 such that they are driven together when a voltage is applied between the upper platinum contact pad 420 and the lower platinum contact pad 425.

The contact pads 420 and 425 may be coated in gold to facilitate bonding to external electronics (not shown). The contact pads 420 and 425 may be replaced or work in conjunction with other routing means such as tethers or vias. In alternative embodiments, the stacked actuators may be operated together, opposite, or patterned to have piezoelectric sides face opposite each other. Further embodiments may have stacks of actuators varying in the number of layers on the same substrate and may also have different contact pads, operating voltages, or charge detection sensitivities.

Figure 5:
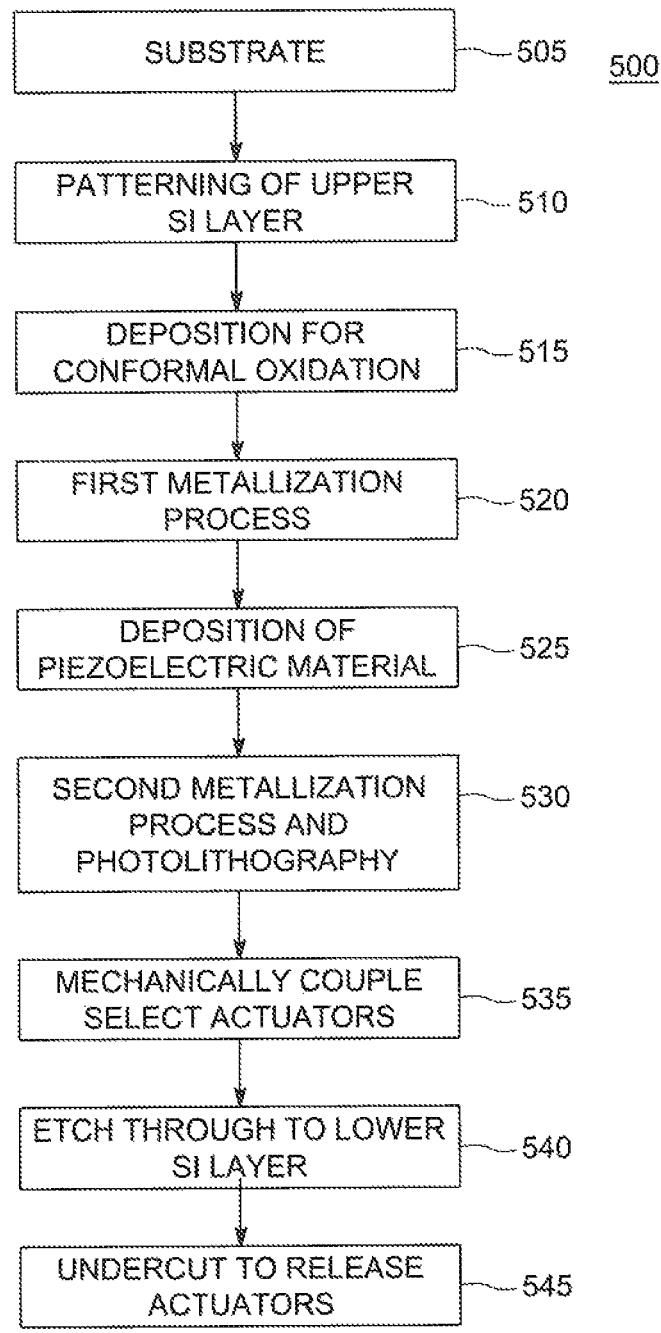
FIG. 5 is a flowchart for another exemplary exemplary embodiment of the present invention applying mechanical couplers.

FIG. 5 is a flowchart for an exemplary embodiment of the present invention using mechanical couplers for optimal mechanical impedance. The process flow 500 begins at step 505 with a substrate that may be SOI substrate comprising silicon. Next, an upper portion of the substrate is etched at step 510, to produce the initial trenches and an oxidation or dielectric layer is added at step 515. A first metallization process step 520 creates a first metal contact for the deposition of piezoelectric material at step 525, which material may be PZT. A second metallization process and photolithography patterning step 530 creates a second metal contact above the deposited piezoelectric material.

In further embodiments, select actuators may then also be mechanically coupled at step 535. Mechanical coupling allows for design specific mechanical impedance matching such that for a given voltage, the force and displacement generated may be alternatively traded based on the requirements of the desired application. One embodiment may leave the trench gaps equidistant, followed by a mechanical coupling dielectric or metal layer (such as electrolytic copper layer, electrolytic nickel layer, or sputtered deposited layer). Alternatively, the actuators may be mechanically coupled during the deposition of the PZT layer step 525, where PZT material is able to fill some of the etch trenches formed by step 510. An etch is applied at step 540 to separate the conformal piezoelectric material into individual actuators and undercut at step 545 to release the actuators. Following the undercutting step 545 to release of the actuators, the actuators are able to oscillate or vibrate when an electrical field is applied across the thickness of the piezoelectric material or conversely, generate a charge from external mechanical stress applied across the piezoelectric material.

Figure 6:
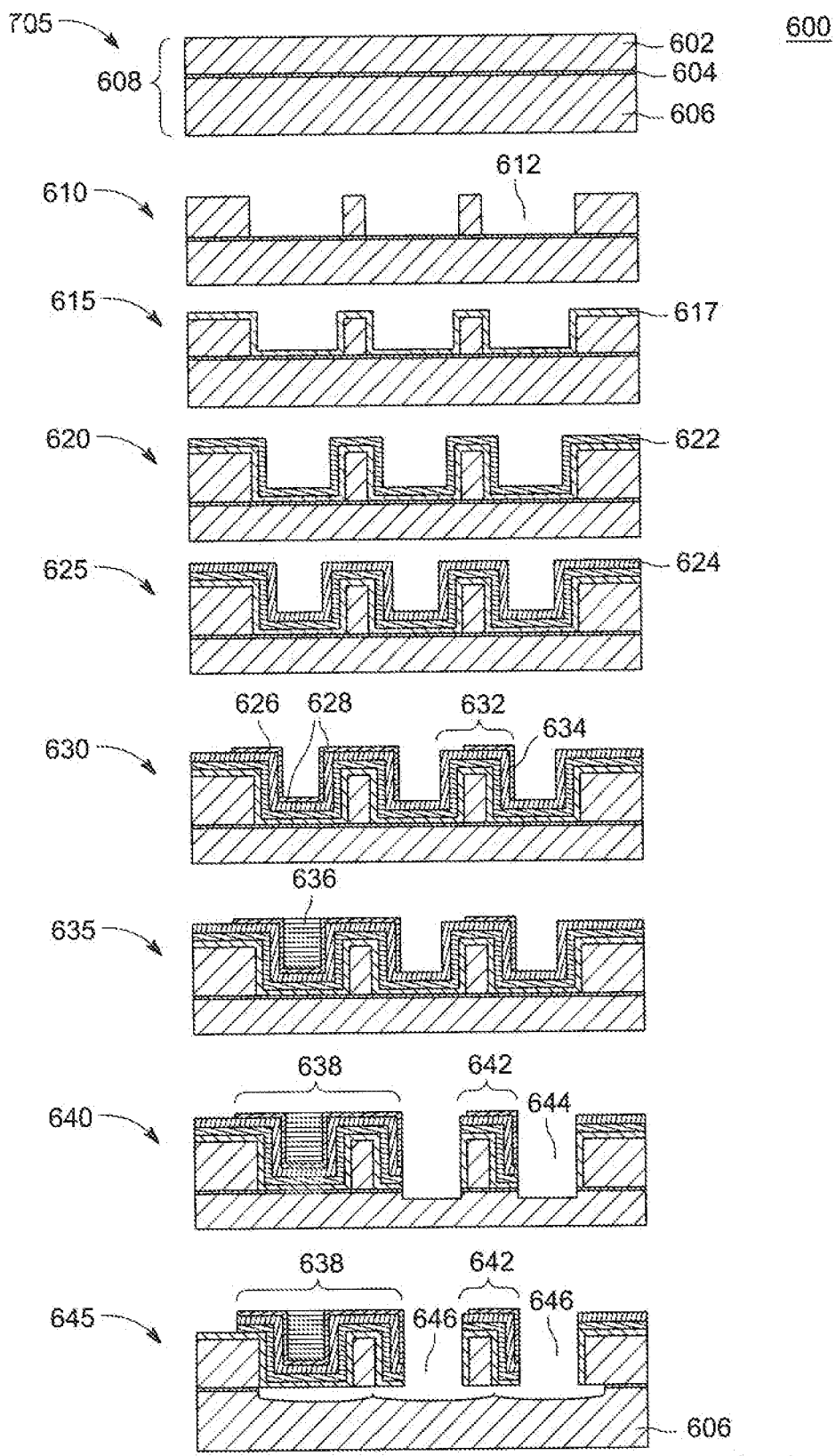
FIG. 6 is a cut-away illustration of an exemplary embodiment of the present invention process flow steps including a mechanical coupler.

FIG. 6 depicts an exemplary embodiment of the invention using PZT MEMS devices. The apparatus process 600 begins with a SOI substrate 605 comprising a bottom side insulator such as silicon dioxide $SiO_2$ layer 608, a lower silicon handle layer 606, a buried $SiO_2$ layer 604, and an upper silicon device layer 602. The next stage 610 etches the device layer 602 with a series of vertical trenches 612. Following the initial etching 610, is the stage 615 of an elastic layer 616 formed by growing a dielectric such as thermal silicon dioxide, or use of atomic layer deposition for oxidation. Once the elastic layer 616 is formed, a metallization stage 620 deposits platinum (Pt) 622 over the elastic layer 617 using growth templates. However, other conductive metals may be realized.

The stage 625 of depositing a piezoelectric material layer 624 on the first metallization layer 622. The piezoelectric material may be formed of other piezoelectric materials but in an exemplary embodiment of the invention is comprised of PZT. The PZT layer 624 may be deposited via spin on techniques, spray on techniques, or atomic layer deposition to adequately conform to the first metallization layer 622. The PZT layer 624 in the next stage 630, is conformally covered (shown as 808) with a second metallization layer (626, 628, 632, and 634) which may also be patterned using photolithography. The patterned second platinum layer 632 covers not just the horizontal top surface 626 of the PZT 624, but also at least one vertical side wall 634. Stage 635 depicts a mechanical coupler 636 that may be added on top of the second platinum layer 628 to couple select multiple actuator arms 638 together. The mechanical coupler 636 may be a dielectric or conductive metal but ultimately is applied to change the force and displacement generated/detected of the coupled actuators 638. Other embodiments may mechanically couple with additional continuous amounts of the PZT layer or through deposition of materials in addition to the filled trench mechanical coupler 636. Next, stage 640 selectively etches the trenches 644 all the way through the piezoelectric layer 624, metal layer 622, elastic layer 617, and BOX 604 into the handle layer 606.

The final stage 645 uses selective xenon difluoride $XeF_2$ etching of horizontal trenches 646 to release the stacked actuator arms (638 and 642) from the underlying handle Si 606 such that the center sections of the PZT 624 are free floating. Horizontal trenches 646 and vertical trenches 612 comprise the same free space.

The released actuators 638 and 642 may now vibrate/oscillate in three dimensions. For example, when an, electric field is applied perpendicularly between the two conductive platinum layers 622 and 632 which effectively surround the PZT 624 layer actuator arm 642 moves. Similarly, when operated as a sensor, charges may be generated by the PZT 624 should the device be placed under external mechanical strain, the charges would be conducted by the two conductive platinum layers 622 and 632 to generate a sensed signal.

Figure 7:
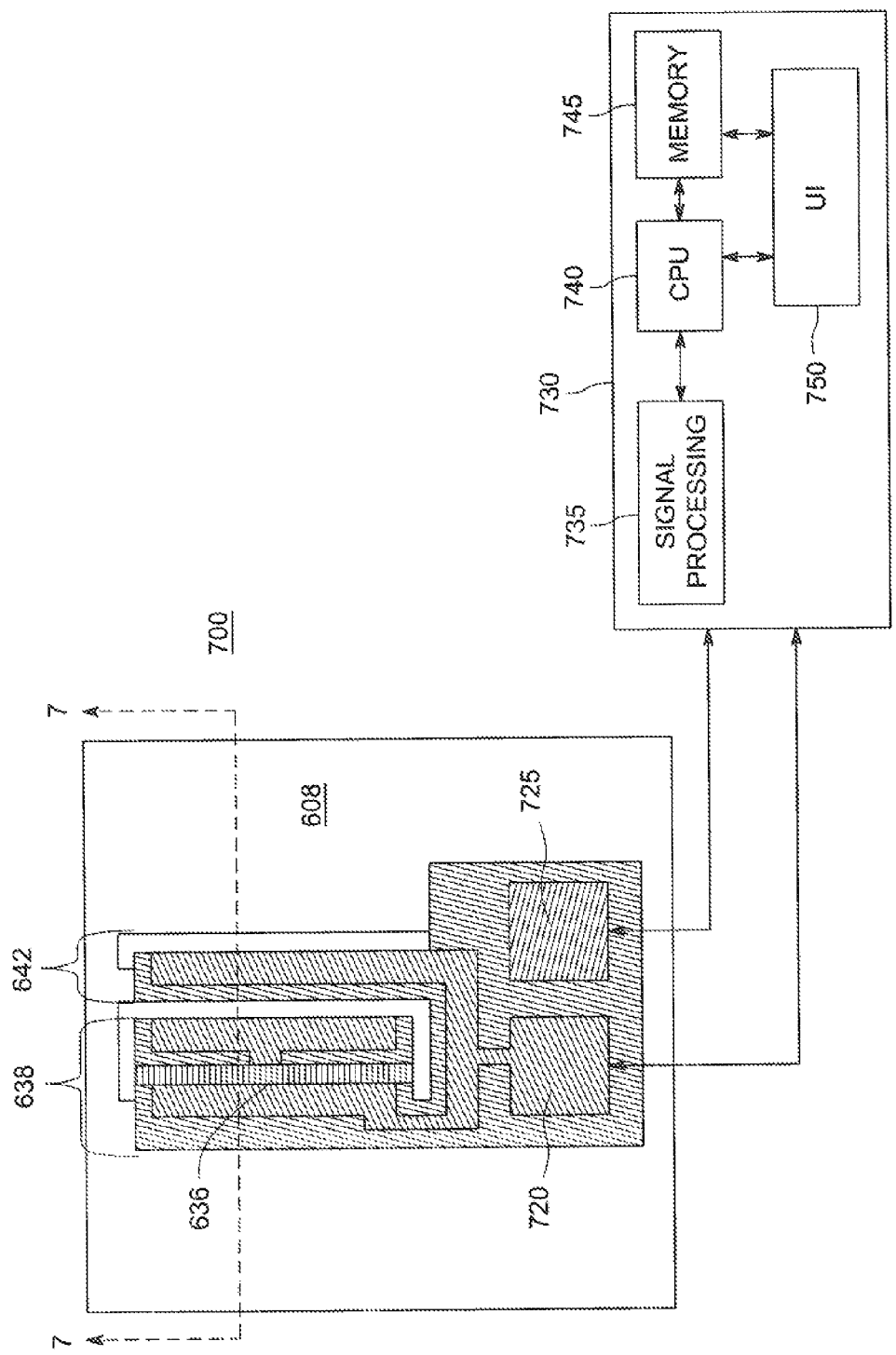
FIG. 7 is a top view of an exemplary embodiment of the present invention achieved through the process of FIG. 6.

FIG. 7 is a top view of an exemplary embodiment of the present invention achieved through the process of FIG. 6. FIG. 7 has the lower top down view showing anchoring of the actuators 638 and 642 on the SOI substrate 608. The top view of a piezoelectric device 700 includes line 7-7 that is the basis for the aforementioned cutaway view of stage 645. The device 700 depicts actuators 638 and 642, which may be jointly coupled in a cantilevered structure to collectively operate as single actuator 638 or independently coupled in a "clamped-clamped" structure such that opposite sides of the actuator (642) are etched to allow movement.

The jointly coupled actuators 638 are mechanically coupled through the mechanical coupler 636 that is parallel on the substrate 608 with the actuators 638. The actuators 638 and 642 are electrically coupled and driven together when a voltage is passed onto the upper platinum contact pad 720 and the lower platinum contact pad 725. The contact pads 720 and 725 may be coated in gold to facilitate bonding to external electronics (not shown). The contact pads 720 and 725 may be replaced or work in conjunction with other routing means such as tethers or vias. In alternative embodiments, the stacked actuators may be operated together, opposite, or patterned to have piezoelectric sides to be opposite to each other. Further embodiments may have stacks of different multiple layers on the same substrate and may have different contact pads with varying operating voltages or charge detection sensitivities.

In devices where the aforementioned structures are used as sensors, charges generated from the PZT 624 are conducted from the upper and lower platinum electrode layers (622, 626, 628, 632, and 634) are sent through contact pads (720 and 725) to external electronic circuitry 730. The external electronics 730 measure a voltage change produced by the moving of the PZT 624 to determine sensed mechanical forces. In other embodiments wherein the actuator is to generate a mechanical force, the electronic circuitry 730 may apply a voltage across the contact pads 720 and 725. The electronic circuitry comprises a signal processing unit 735, a CPU 740, electronic memory 745, and user interface 750. Exemplary embodiments of the signal processing unit may comprise amplifiers, oscillators, analog to digital converters, digital to analog converters and the like. The CPU 740 may be a microcontroller or microprocessor. The memory 745 may store instructions for processing as well as previously sensed data. The user interface may further include input devices as well as a user display.

The reduction in size using thin film materials such as PZT has allowed mechanical vibrations or sensors to be used in fertility treatments, surgery, and other applications where small form factor mechanical stress is needed to be applied or detected. However, traditional piezoelectric applications are still feasible with the foregoing embodiments such as cantilevers, transducers, capacitors, and motors.

While the foregoing is directed to the illustrated embodiments of the present invention, other and further embodiments of the invention may be devised without departing from the basic scope thereof.

The invention claimed is:

1. A method for fabricating a piezoelectric device, comprising:
   etching a series of vertical trenches in a top substrate portion;
   depositing a first continuous conductive layer over the trenches and substrate;
   depositing a continuous piezoelectric layer over the first continuous conductive layer such that the piezoelectric material has trenches and sidewalks;
   depositing a second continuous conductive layer over the continuous piezoelectric layer;
   etching through the vertical trenches of the first continuous conductive layer, continuous piezoelectric layer, second continuous conductive layer, and top substrate portion into a bottom substrate portion; and
   etching a series of horizontal trenches in the bottom substrate portion such that the horizontal trenches and vertical trenches occupy a continuous free space and allow movement of a piezoelectric MEMS device created by the above method in three dimensions.

2. The method of claim 1, wherein the piezoelectric layer comprises lead zirconate titanate (PZT).

3. The method of claim 1, wherein the conductive layers comprise of at least one of bi-layers of titanium dioxide ($TiO_2$)/platinum (Pt), $IrO_2$, or $RuO_2$.

4. The method of claim 1, wherein the horizontal and vertical trenches form at least two actuator arms capable of moving in three dimensions to sense external forces or actuating when a voltage is applied across the continuous conductive layers.

5. The method of claim 4, depositing a coupling layer into a trench to mechanically couple the at least two actuator arms.

6. The method of claim 5, wherein the coupling layer comprises a conductive metal.

7. The method of claim 1, further comprising patterning the second continuous metal layer such that the top surface and at least one sidewall of the piezoelectric layer remains underneath the second continuous metal layer.

8. The method of claim 1, wherein the continuous conductive layers further form contact pads to connect to external electronic circuitry.

9. A piezoelectric apparatus, comprising:
   a substrate;
   a first stacked actuator arm comprising a piezoelectric layer disposed between a first conductive layer and a second conductive layer on the substrate;
   a second stacked actuator arm comprising the piezoelectric layer disposed between the first conductive layer and the second conductive layer on the substrate; and
   the first and second stacked actuator arm separated from each other by a vertical trench and separated from the substrate by a horizontal trench such that the actuators are capable of movement in three dimensions.

10. The apparatus of claim 9, wherein the piezoelectric layer comprise lead zirconate titanate (PZT).

11. The apparatus of claim 9, wherein the conductive layers comprise bilayers of titanium-dioxide ($TiO_2$)/platinum (Pt) or conductive oxides such as $IrO_2$ or $RuO_2$.

12. The apparatus of claim 9, further comprising the second conductive layer having patterning such that the top surface and at least one sidewall of the piezoelectric layer remains underneath the second continuous conductive layer.

13. The apparatus of claim 9, wherein the horizontal and vertical trenches form at least two actuator arms capable of moving in three dimensions to sense external forces, or actuating when a voltage is applied across the continuous conductive layers.

14. A method for detecting force on a piezoelectric device comprising a first stacked actuator arm and a second actuator arm, wherein each stacked actuator arm comprises a piezoelectric layer deposited between a first conductive layer and a second conductive layer on the substrate the method comprising:
   generating electrical charges from movement of the first stacked actuator arm and the second stacked actuator arm, wherein the first stacked actuator arm and second stacked actuator arm are separated from each other by a vertical trench and separated from the substrate by a horizontal trench such that the actuators are capable of movement in multiple dimensions;
   conducting the electrical charges of the first stacked actuator arm and second stacked actuator arm via the first conductive layer and the second conductive layer through contact pads;
   sending the electrical charges to external electronic circuitry for processing; and
   calculating a force using the external electronic circuitry based on the electrical charge.

* * * * *